United States Patent
Zhu et al.

(10) Patent No.: US 11,212,927 B2
(45) Date of Patent: Dec. 28, 2021

(54) EXTENDABLE DISPLAY SCREEN STRUCTURE

(71) Applicant: Jiangsu Kangrui New Material Technology Co., Ltd., Wuxi (CN)

(72) Inventors: Wei Zhu, Wuxi (CN); Haolin Chuang, Wuxi (CN); Chengwei Wang, Wuxi (CN)

(73) Assignee: Jiangsu Kangrui New Material Technology Co., Ltd., Jiangyin (CN)

( * ) Notice: Subject to any disclaimer, the term of this patent is extended or adjusted under 35 U.S.C. 154(b) by 0 days.

(21) Appl. No.: 16/772,836

(22) PCT Filed: Jan. 11, 2019

(86) PCT No.: PCT/CN2019/071286
§ 371 (c)(1),
(2) Date: Jun. 15, 2020

(87) PCT Pub. No.: WO2020/143015
PCT Pub. Date: Jul. 16, 2020

(65) Prior Publication Data
US 2021/0227708 A1    Jul. 22, 2021

(51) Int. Cl.
*H05K 5/02* (2006.01)
*G09F 9/30* (2006.01)
(Continued)

(52) U.S. Cl.
CPC .......... *H05K 5/0217* (2013.01); *G09F 9/301* (2013.01); *G09F 9/3026* (2013.01);
(Continued)

(58) Field of Classification Search
CPC .... H05K 5/0217; H05K 5/0017; G09F 9/301; G09F 9/3026; G06F 1/1624; G06F 1/1652
See application file for complete search history.

(56) References Cited

U.S. PATENT DOCUMENTS 10,193,095 B2 *  1/2019  Seo ................. G06F 1/1601
11,107,374 B2 *  8/2021  Lee ................. G09F 9/301
(Continued)

FOREIGN PATENT DOCUMENTS

CN    102804740 A    11/2012
CN    106097896 A    11/2016
(Continued)

OTHER PUBLICATIONS

International Search Report, issued in PCT/CN2019/071286, dated Aug. 27, 2019.
(Continued)

*Primary Examiner* — Hung S. Bui
*Assistant Examiner* — Sagar Shrestha
(74) *Attorney, Agent, or Firm* — Zhu Lehnhoff LLP

(57) ABSTRACT

An extendable display screen structure, wherein a hollow part is provided on at least one side of a main base and two guiding components are symmetrically provided in the main base along two sides of the hollow part; at least one driving component is provided in the main base, and the driving component is provided with a power source to drive the driving component to move along the guiding component; at least one side of a flexible screen is wound around an outer periphery of at least one rotating shaft, the rotating shaft is rotatably disposed on a side of the driving component and forms linkage, the driving component, in linkage with the rotating shaft, moves along the guiding component out of the main base, whereby the flexible screen can be gradually released from the outer periphery of the rotating shaft to be extended outwards, and on the contrary, the driving component, in linkage with the rotating shaft, gradually moves into the main base, whereby the rotating shaft retracts the flexible screen.

7 Claims, 11 Drawing Sheets

(51) Int. Cl.
    *G09F 9/302*     (2006.01)
    *H05K 5/00*     (2006.01)
    *G06F 1/16*     (2006.01)

(52) U.S. Cl.
    CPC ......... *H05K 5/0017* (2013.01); *G06F 1/1624* (2013.01); *G06F 1/1652* (2013.01)

(56) References Cited

U.S. PATENT DOCUMENTS

| | | | | |
|---|---|---|---|---|
| 2005/0041012 | A1* | 2/2005 | Daniel | G06F 1/1601 345/156 |
| 2007/0146243 | A1* | 6/2007 | Yang | G06F 1/1601 345/76 |
| 2011/0176260 | A1* | 7/2011 | Walters | G06F 1/1641 361/679.01 |
| 2012/0212433 | A1* | 8/2012 | Lee | G06F 3/041 345/173 |
| 2014/0194165 | A1* | 7/2014 | Hwang | G06F 1/1652 455/566 |
| 2015/0116921 | A1* | 4/2015 | Hsu | G06F 1/1624 361/679.27 |
| 2015/0169274 | A1* | 6/2015 | Holung | G06F 3/1423 345/1.3 |
| 2015/0229844 | A1* | 8/2015 | Yamazaki | G03B 15/05 348/333.01 |
| 2016/0163242 | A1 | 6/2016 | Lee et al. | |
| 2016/0320804 | A1* | 11/2016 | Takayanagi | G06F 1/1615 |
| 2016/0381814 | A1 | 12/2016 | Wang | |
| 2017/0123536 | A1* | 5/2017 | Aurongzeb | G06F 1/1615 |
| 2018/0033992 | A1* | 2/2018 | Seo | G06F 1/1652 |
| 2018/0103550 | A1* | 4/2018 | Seo | H04N 5/64 |
| 2020/0253063 | A1* | 8/2020 | Jiang | G06F 1/1652 |
| 2020/0337159 | A1* | 10/2020 | Yang | G06F 1/1626 |
| 2020/0363841 | A1* | 11/2020 | Kim | G06F 1/1675 |
| 2021/0120685 | A1* | 4/2021 | Zhu | G06F 1/1647 |

FOREIGN PATENT DOCUMENTS

| | | |
|---|---|---|
| CN | 206301242 U | 7/2017 |
| CN | 207529588 U | 6/2018 |
| CN | 109062334 A | 12/2018 |
| CN | 209418055 U | 9/2019 |
| EP | 3088986 A1 | 11/2016 |
| KR | 20170025520 A | 3/2017 |
| KR | 101735470 B1 | 5/2017 |
| KR | 20170055865 A | 5/2017 |
| WO | 2018214705 AI | 11/2018 |

OTHER PUBLICATIONS

Written Opinion, issued in PCT/CN2019/071286, dated Sep. 11, 2019.

Supplementary European Search Report, issued by EPO in EP19894397.9, dated Jul. 23, 2021.

Examination Report, issued in Chinese App. 201980000050.0 (priority application), by CNIPA, dated Aug. 4, 2021.

Examination Report, issued in Indian App. 202047024739 (counterpart app), by INIPA, dated Jun. 12, 2021.

Examination Report, issued in Japanese App. 2020-535558 (counterpart app), by Japan Patent Office, dated Jun. 21, 2021.

* cited by examiner

EXTENDABLE DISPLAY SCREEN STRUCTURE

TECHNICAL FIELD

The invention relates to an extendable display screen structure, in particular to a technical means for driving a rotating shaft to move by a transversely movable driving component to expand and retract a flexible screen.

BACKGROUND ART

It is known in the art to employ a plurality of monitors (or display screens) merged with each other to form a larger screen (or television wall) structure as another technical means of video output. For example, typical embodiments are provided in the Taiwan Patent No. 99141387 entitled "All-in-One Screen Capable of Automatically Switching Displays" and the Patent No. 102147287 entitled "Display Device and Method for Combining Display Screens According to Merging Instructions".

The patents US2005/008463 A1 "Expanded Display for Cell Phone, Palm Pilot or Computer", U.S. Pat. No. 7,848,091 B2 "Dual-Screen Mobile Display Device", and US2012/0182295 A1 "Personal Portable Communication Devices with Deployable Display Systems for Three Dimensional Visual Representations and/or Privacy and Methods of Use" also disclose the use of a plurality of movable screens in conjunction with a rotating shaft drive to move the screens from a stowed position to a deployed position.

The above reference shows different design techniques regarding the structure and application of the conventional display screen apparatus. In practical application, however, gaps between the monitors (or display screens) are unavoidable when combining a plurality of monitors (or display screens) into a larger screen (or television wall), and these crisscross gaps not only influence the integrity of the display of the larger screen (or television wall), but also are easy to cause visual fatigue of viewers, resulting in a defect in this application.

However, as the flexible (soft) screen technology matures, a large-area flexible (soft) screen can be rolled into a small volume, which addresses the above known defect. In view of the above known defect of the larger screen (or television wall) structure formed by merging a plurality of monitors (or display screens), the present invention was developed by the inventor as an improvement to the prior art.

SUMMARY OF THE INVENTION

It's an object of the invention to provide an extendable display screen structure, wherein at least one side of a flexible screen is wound around an outer periphery of at least one rotating shaft, and a driving component drives the rotating shaft to perform reciprocating transverse movement, whereby the flexible screen can be expanded outwards or retracted inwards, a larger and integral display screen is formed when expanded, and the volume and the display area can be effectively reduced when retracted, being convenient to store and carry.

It's another object of the invention to provide an extendable display screen structure, wherein the extendable display screen structure is provided with a main base capable of accommodating the driving component, hollow parts are provided on at least one side of the main base, respectively, and guiding components are provided on upper and lower sides of a corresponding hollow part, respectively, for guiding the driving component to expand and retract; wings are provided on upper and lower sides of the hollow part, respectively, outside the main base, and when the wing is retracted inwards, the wing can just shield the hollow part to protect the components in the main base; when the wing is extended outwards, a guiding runner can be preset to guide the movement of the rotating shaft, so that the flexible screen can be extended stably in an expected direction.

It is still another object of the present invention to provide an extendable display screen structure, wherein each of the wings forms a positioning part at one end distal to the main base with respect to the guiding runner, and each of the positioning parts can extend to both outer sides of the main base when each of the wings is extended outwards, so that after the flexible screen is fully extended, the rotating shaft can extend into the positioning part while leaving an elastic biasing space with a front side (or rear side) of the main base, without contacting the main base improperly, moreover, an outer side of the driving component generates an elastic biasing force on the rotating shaft to pull the flexible screen properly under tension, so that wrinkles due to loosening of the flexible screen can be effectively eliminated.

In order to achieve the above objects and effects, the technical solution implemented by the present invention comprises: a hollow main base, at least one driving component, and a flexible screen, wherein the hollow main base is provided with at least one hollow part which opens to the outside, and guiding components are symmetrically provided in the main base along two sides of the hollow part, respectively; the at least one driving component is provided in the main base, and the driving component can move along the guiding component to extend out of the main base; the flexible screen is wound around an outer periphery of at least one rotating shaft, the rotating shaft is rotatably disposed on the driving component, can move out of a side of the main base preferentially and form linkage, and when the driving component, in linkage with the rotating shaft, moves to the outside of the main base along the guiding component, the flexible screen can be gradually released and extended outwards from the outer periphery of the rotating shaft.

In the above structure, the driving component is provided with a power source, and the power source can drive the driving component to move along the guiding component.

In the above structure, the main base is provided with two opposite first and second hollow parts, two forward guiding components are symmetrically arranged in the main base along two sides of the first hollow part, and two backward guiding components extending in a reverse direction to the forward guiding components are symmetrically arranged in the main base along two sides of the second hollow part; the two driving components are provided in the main base, each of the driving components is provided with a power source that drives the driving component to move along the forward or backward guiding component, respectively; two sides of the flexible screen are respectively wound around the outer peripheries of the first rotating shaft and the second rotating shaft, the first rotating shaft and the second rotating shaft are rotatably arranged, respectively, on sides of the two driving components to form linkage, and when the two driving components, in linkage with the first rotating shaft and the second rotating shaft respectively, move out of the main base along the forward guiding component and the backward guiding component, the flexible screen can be gradually released from the peripheries of the first rotating shaft and the second rotating shaft to be extended outwards.

In the above structure, the main base is provided pivotably with first side wings on two sides of the first hollow part, respectively, the two first side wings can be turned inwards to cover the first hollow part, and can be turned outwards to open the first hollow part; moreover, second side wings are provided pivotably on two sides of the second hollow part, respectively, the two second side wings can be turned inwards to cover the second hollow part, and can be turned outwards to open the second hollow part.

In the above structure, the two first side wings are respectively provided with a first side guiding runner engaged with the forward guiding component on a side surface facing the first hollow part when retracted, and the first side guiding runners can form sliding guide to engage the forward guiding component on two ends of the first rotating shaft when the first side wings horizontally extend outwards; the two second side wings are respectively provided with a second side guiding runner engaged with the backward guiding component on a side surface facing the second hollow part when retracted, and the second side guiding runners can form sliding guide to engage the backward guiding component on two ends of the second rotating shaft when the second side wings horizontally extend outwards.

In the above structure, a positioning part with a biasing space is formed on the first guiding runner and the second guiding runner, respectively, at an end distal to the main base, and the positioning parts protrude out of a front side or a rear side of the main base with ends aligned.

In the above structure, each of the driving components is respectively provided with a set of linkage components driven by the power source, and each set of linkage components is respectively connected to the forward guiding component and the backward guiding component.

In the above structure, the forward guiding component and the backward guiding component are forward and backward racks arranged in opposite directions, the power sources are motors, and the linkage components are output gears driven by the motors and meshed with the forward and backward racks, respectively.

In the above structure, the two driving components are respectively provided with two parallel main holders, the first rotating shaft and the second rotating shaft are respectively provided pivotably with a rotating shaft holder proximate to two ends, the rotating shaft holder of the first rotating shaft is pivotably connected with the two main holders of one of the driving components, the rotating shaft holder of the second rotating shaft is pivotably connected with the two main holders of the other driving component, and each of the rotating shaft holders has pivot elasticity relative to the main holders pivotably connected therewith, so that the rotating shaft holders of the first rotating shaft and the second rotating shaft generate tensile elasticity on two sides of the flexible screen, respectively, thereby ensuring that the flexible screen can maintain a tensioned and flattened state after being completely extended.

In the above structure, the main base is provided with two parallel first and two frame strips, a first side plate and a second side plate are attached to two sides of the first frame strip and the second frame strip, respectively, so that a hollow accommodating space is enclosed by the first frame strip, the second frame strip, the first side plate and the second side plate, and the first hollow part and the second hollow part are respectively formed on two sides of the accommodating space between the first frame strip and the second frame strip.

In order that the above objects, effects and features of the present invention may be more particularly understood, reference is now made to the following drawings, in which:

Figure 1:
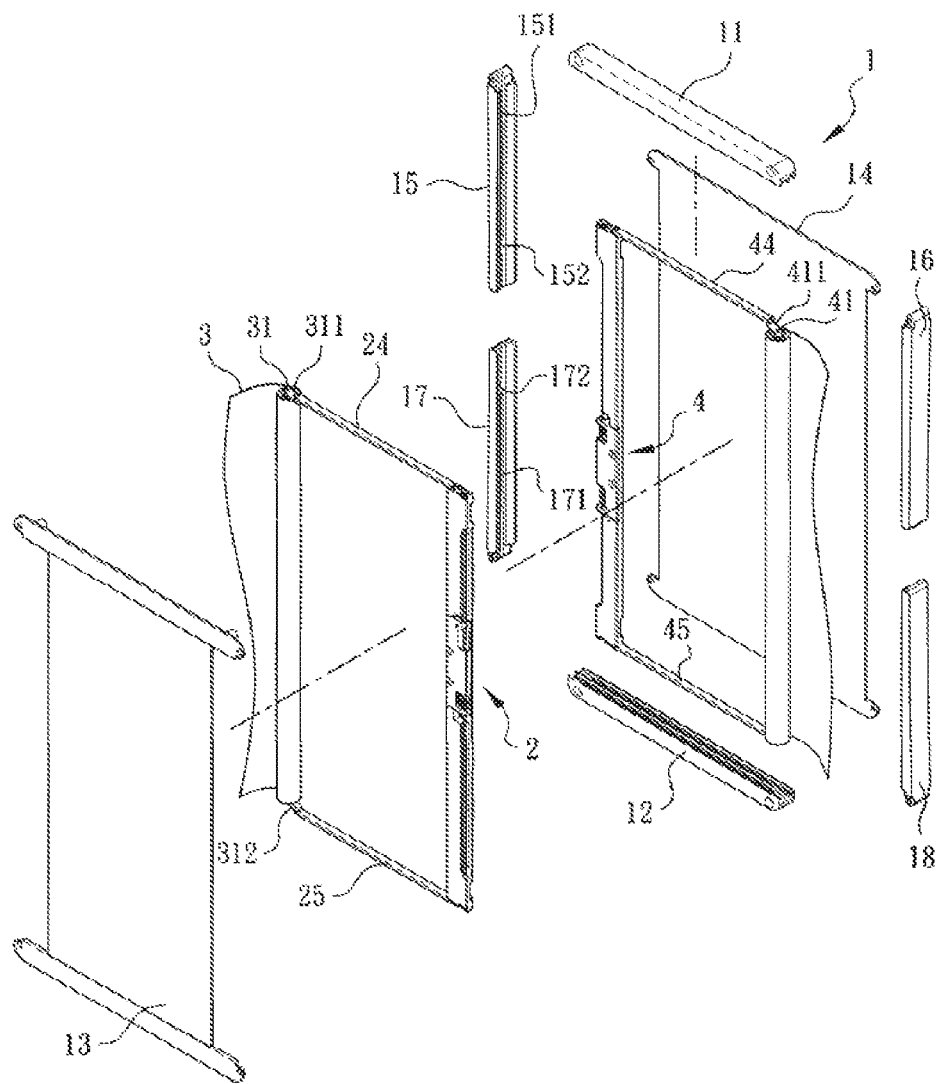
FIG. 1 shows a perspective exploded view of the present invention.
Figure 2:
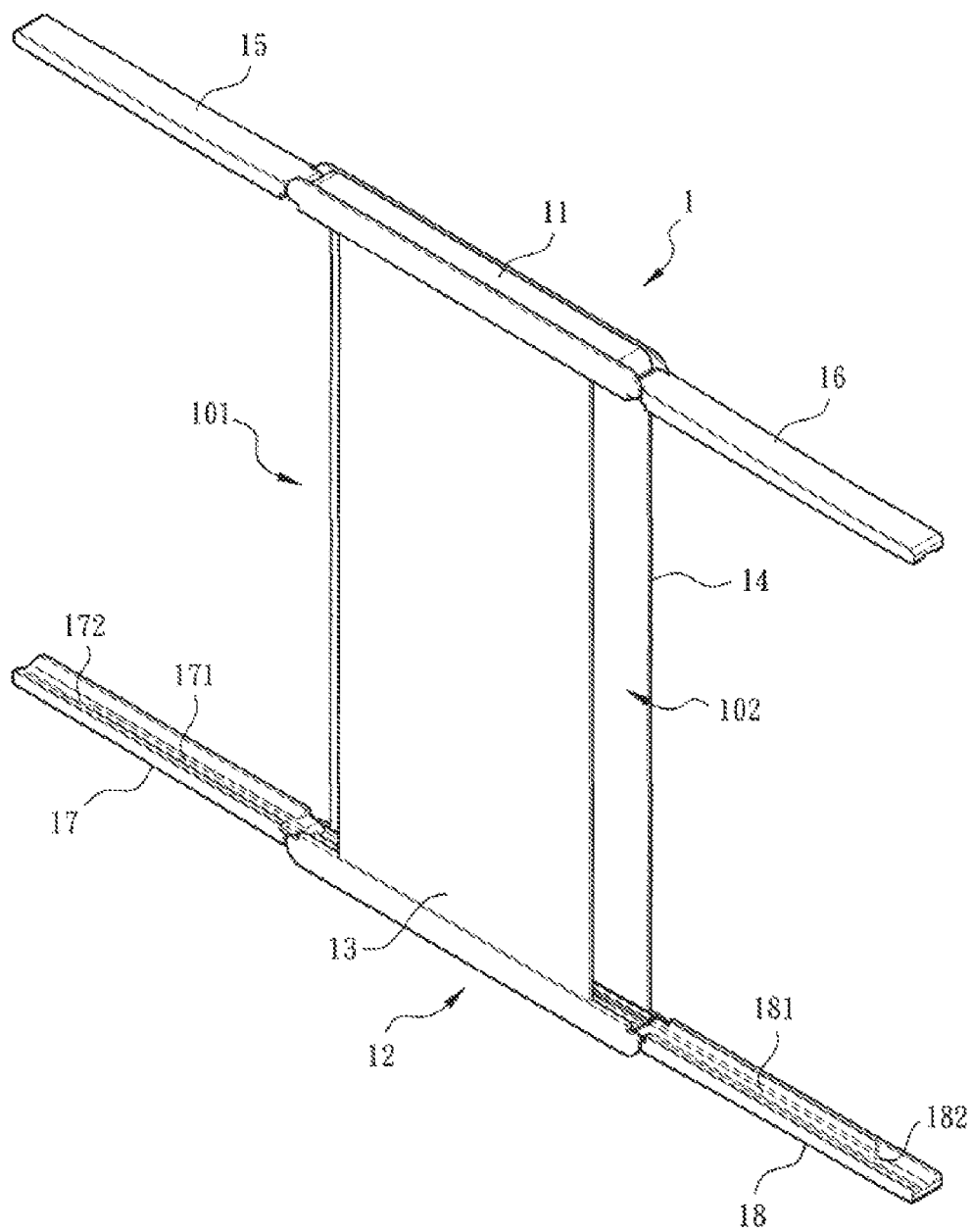
FIG. 2 shows a main base having components thereof assembled according to the present invention.
Figure 3:
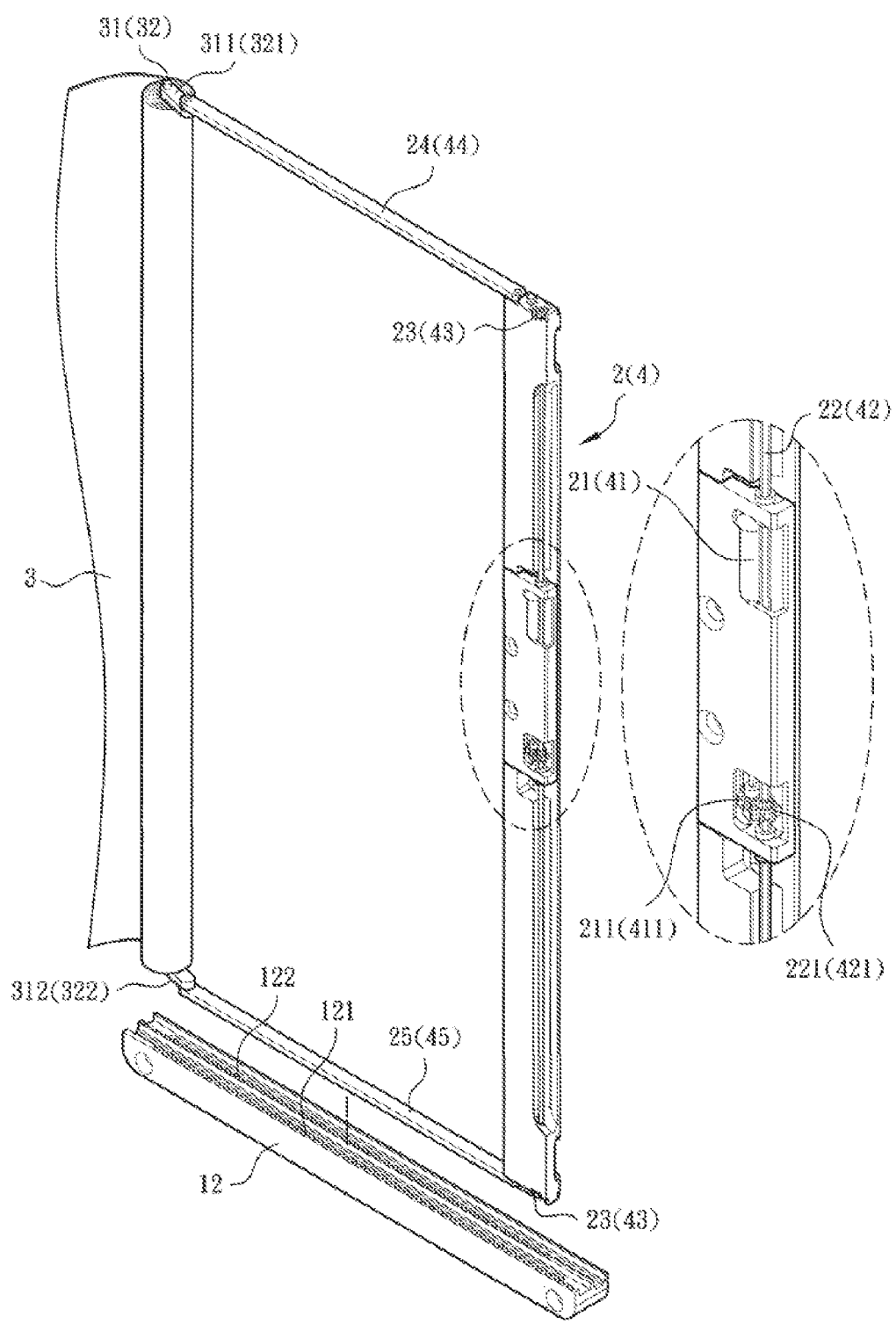
FIG. 3 is a schematic diagram showing a partial structure of a driving component, a flexible screen, a second frame strip and the like according to the present invention.
Figure 4:
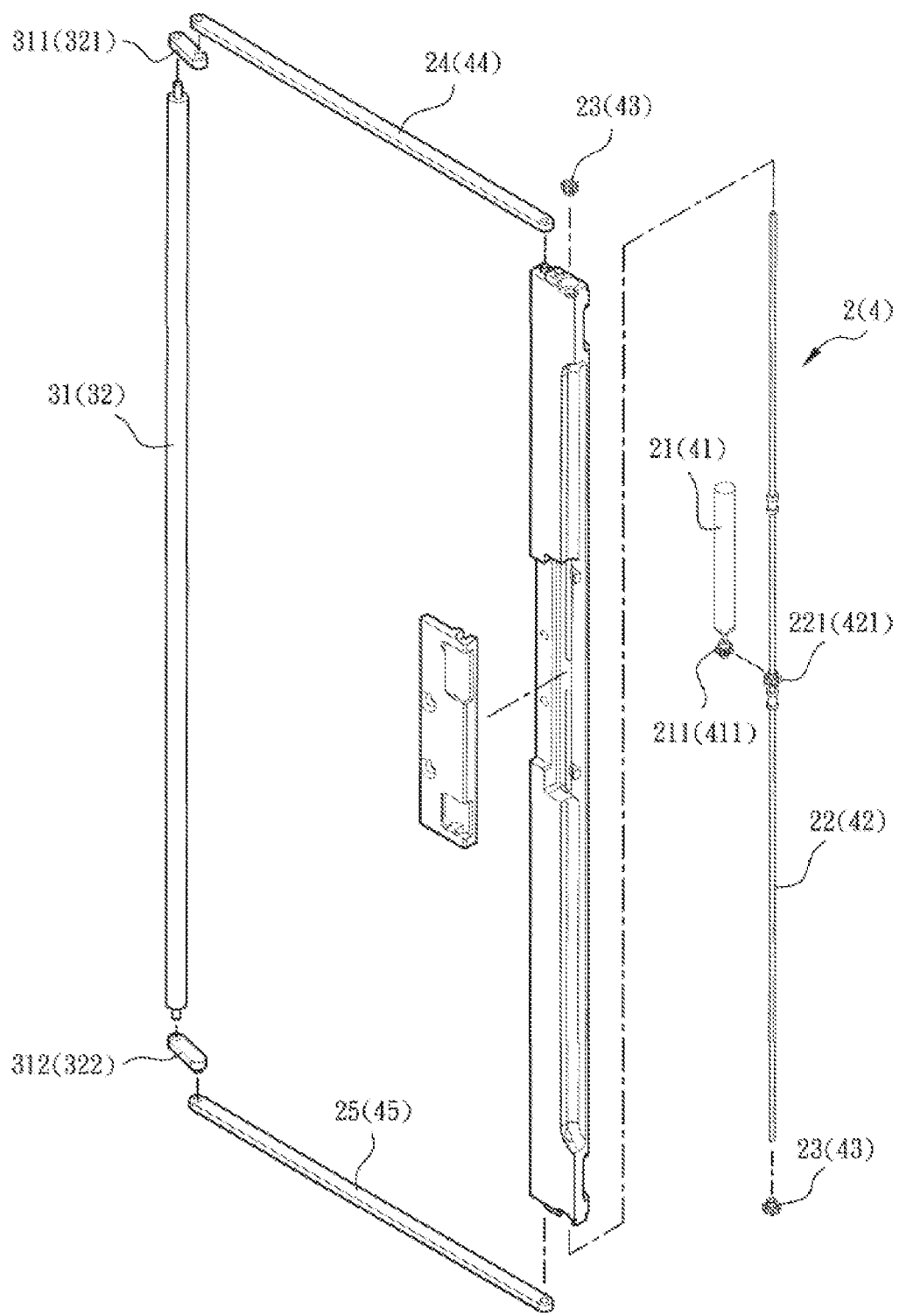
FIG. 4 shows an exploded view of the driving component and a rotating shaft according to the present invention.

REFERENCE NUMERALS IN THE DRAWINGS 1 main base
11 first frame strip
111, 121 forward guiding component
112, 122 backward guiding component
12 second frame strip
13 first side plate
14 second side plate
101 first hollow part
102 second hollow part
15, 17 first side wing
16, 18 second side wing
151, 171 first side guiding runner
161, 181 second side guiding runner
152, 162, 172, 182 positioning part
2, 4 driving component
21, 41 power source
211, 411 driving gear
22, 42 driving component
221, 421 linkage gear
23, 43 linkage component
24, 25, 44, 45 main holder
3 flexible screen
31 first rotating shaft
32 second rotating shaft
311, 312, 321, 322 rotating shaft holder

DETAILED DESCRIPTION OF THE INVENTION

Reference will now be made to the accompanying drawings and embodiments to further describe the implementations of the present invention. The following embodiments are only intended to more clearly illustrate the technical solution of the present invention and are not intended to limit the scope of the present invention. Referring to FIGS. 1 to 4, it can be seen that the main structure of the present invention includes: a main base 1, two driving components 2 and 4 and a flexible screen 3; the main base 1 is provided with a first frame strip 11 and a second frame strip 12 which are parallel, a first side plate 13 and a second side plate 14 are attached to two sides of the first frame strip 11 and the second frame strip 12, respectively, so that a hollow accommodating space is enclosed by the first frame strip 11, the second frame strip 12, the first side plate 13 and the second side plate 14, and a first hollow part 101 and a second hollow part 102 which open outwards are respectively formed towards two sides of the accommodating space between the first frame strip 11 and the second frame strip 12.

A forward guiding component 111 (which can be a forward rack) and a backward guiding component 112 (which can be a backward rack) extending in a reverse direction to the forward guiding component 111 are provided in the first frame strip 11, a first side wing 15 and a second side wing 16 are respectively pivotably provided at two ends of the first frame strip 11, and a first side guiding runner 151 and a second side guiding runner 161 are provided on each of the first side wing 15 and second side wing 16 to engage sides of the forward guiding component 111 and the backward guiding component 112, respectively; and a forward guiding component 121 and a backward component 122 (which can be respectively a forward rack and a backward rack) corresponding to the forward guiding component 111 and the backward component 112 are provided in the second frame strip 12, respectively, a first side wing 17 and a second side wing 18 are respectively pivotably provided at two ends of the second frame strip 12, and a first side guiding runner 171 and a second side guiding runner 181 are respectively provided on each of the first side wing 17 and the second side wing 18 to engage sides of the forward guiding component 121 and the backward guiding component 122, respectively.

In one possible embodiment, bent positioning parts 152, 172, 162 and 182 are formed on the first and second side guiding runners 151, 171, 161 and 181, correspondingly, at ends distal to the first frame strip 11 and the second frame strip 12, and the positioning parts 152, 172, 162 and 182 protrude out of a front (or a rear) side of the first side plate 13 (or the second side plate 14) with ends aligned.

The driving components 2 and 4 have the same structure and are arranged in the main base 1 in opposite directions, the driving components 2 and 4 are provided with power sources 21 and 41, driving components 22 and 42 driven by the power sources 21 and 41, and linkage components 23 and 43 driven by the driving components 22 and 42, respectively, and the linkage components 23 and 43 are connected to the forward guiding components 111 and 121 and the backward guiding components 112 and 122, respectively; and main holders 24 and 25 and main holders 44 and 45 are pivotably connected at sides of the two driving components 2 and 4, respectively, and extend in opposite directions.

In one possible embodiment, the power sources 21 and 41 may be motors having driving gears 211 and 411, respectively, for outputting power, and the driving components 22 and 42 are shafts having linkage gears 221 and 421 in the middle of each shaft for meshing with the driving gears 211 and 411, the linkage components 23 and 43 are output gears provided at both ends of each of the shafts, and the two linkage components 23 (output gears) are engaged with the two forward guiding components 111 and 121 (forward racks), respectively, and the two linkage components 43 (output gears) are engaged with the backward guiding components 112 and 122 (output gears), respectively; the power sources 21 and 41 (motors) are used for driving the driving components 22 and 42 (shafts) to rotate through the driving gears 211 and 411 and the linkage gears 221 and 421, and the linkage components 23 and 43 (output gears) can be driven to rotate on the forward guiding components 111 and 121 (forward racks) and the backward guiding components 112 and 122 (backward racks), thereby moving the driving components 2 and 4 along the forward guiding components 111 and 121 (forward racks) and the backward guiding components 112 and 122 (backward racks).

The flexible screen 3 passes through an outer side of the first side plate 13 (or the second side plate 14) in the middle section, two sides of the flexible screen 3 are respectively wound around the outer peripheries of a first rotating shaft 31 and a second rotating shaft 32, and the first rotating shaft 31 and the second rotating shaft 32 are respectively arranged in the main base 1 proximate the sides of the first hollow part 101 and the second hollow part 102; two ends of the first rotating shaft 31 extend to sides of the first side guiding runners 151 and 171 of the first side wings 15 and 17, respectively, parts close to the two ends of the first rotating shaft 31 are respectively provided pivotably at an end of rotating shaft holders 311 and 312, the other end of the two rotating shaft holders 311 and 312 is provided pivotably at ends of the two main holders 24 and 25, respectively, and the two rotating shaft holders 311 and 312 have pivot elasticity relative to the two main holders 24 and 25 pivotably connected therewith, so that the two rotating shaft holders 311 and 312 can generate tensile elasticity on one side of the flexible screen 3; two ends of the second rotating shaft 32 extend to sides of the second side guiding runners 161 and 181 of the second side wings 16 and 18, respectively, parts close to the two ends of the second rotating shaft 32 are respectively provided pivotably at an end of rotating shaft holders 321 and 322, the other end of the two rotating shaft holders 321 and 322 are provided pivotably at ends of the two main holders 44 and 45, respectively, and the two rotating shaft holders 321 and 322 have pivot elasticity relative to the two main holders 44 and 45 pivotably connected therewith, so that the two rotating shaft holders 321 and 322 can generate tensile elasticity on one side of the flexible screen 3.

Figure 5:
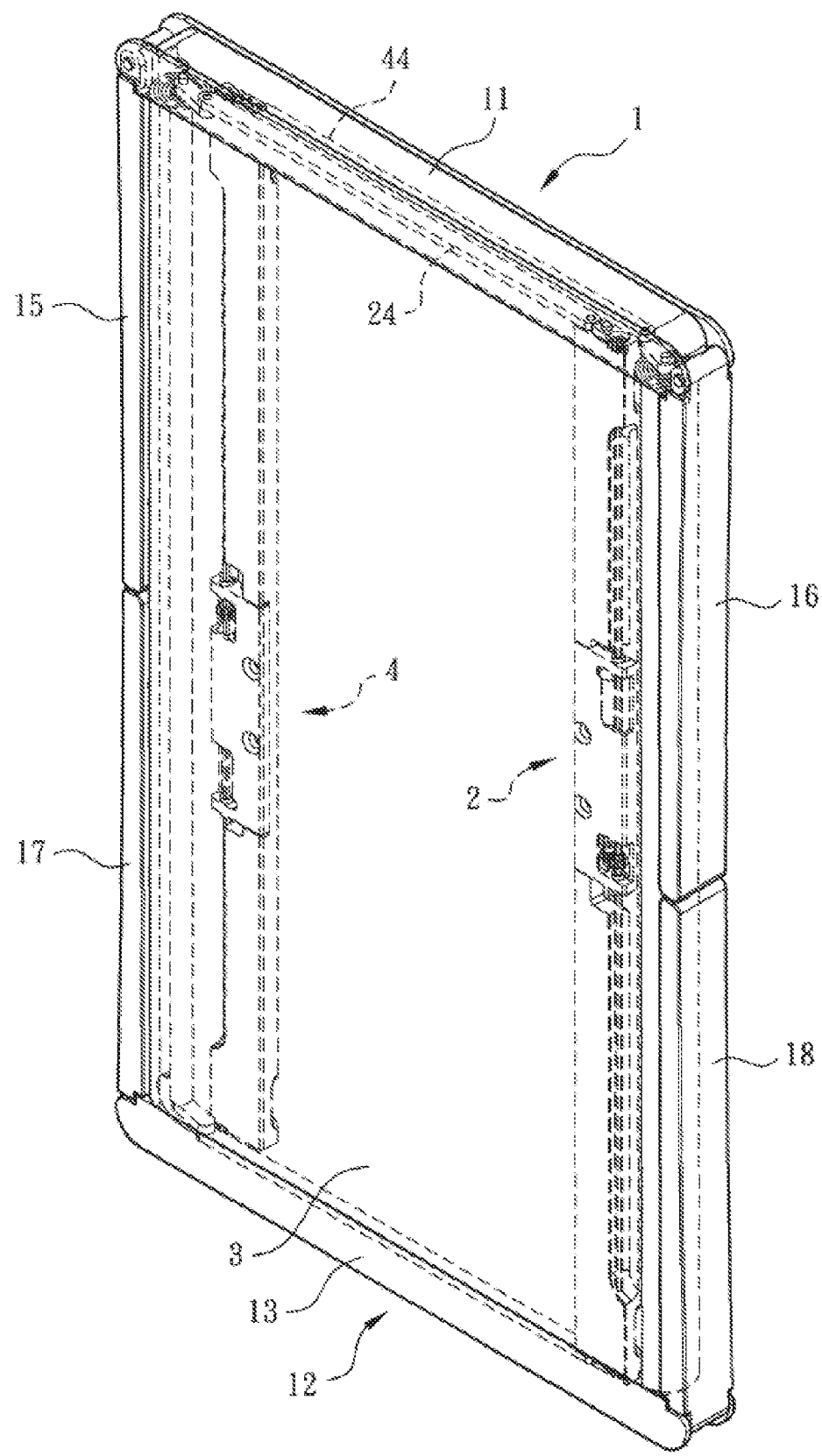
FIG. 5 shows a structure of assembled components when wings are retracted according to the present invention.

Referring to FIGS. 5 to 11, it can be seen that when the present invention is in the retracted state, the driving components 2 and 4 are accommodated in the accommodating space of the main base 1, and the two first wings 15 and 17 are attached to the outside of the first hollow part 101, and the two second wings 16 and 18 are attached to the outside of the second hollow part 102 (as shown in FIG. 5), so that the retracted structure has the minimum overall volume.

Figure 6:
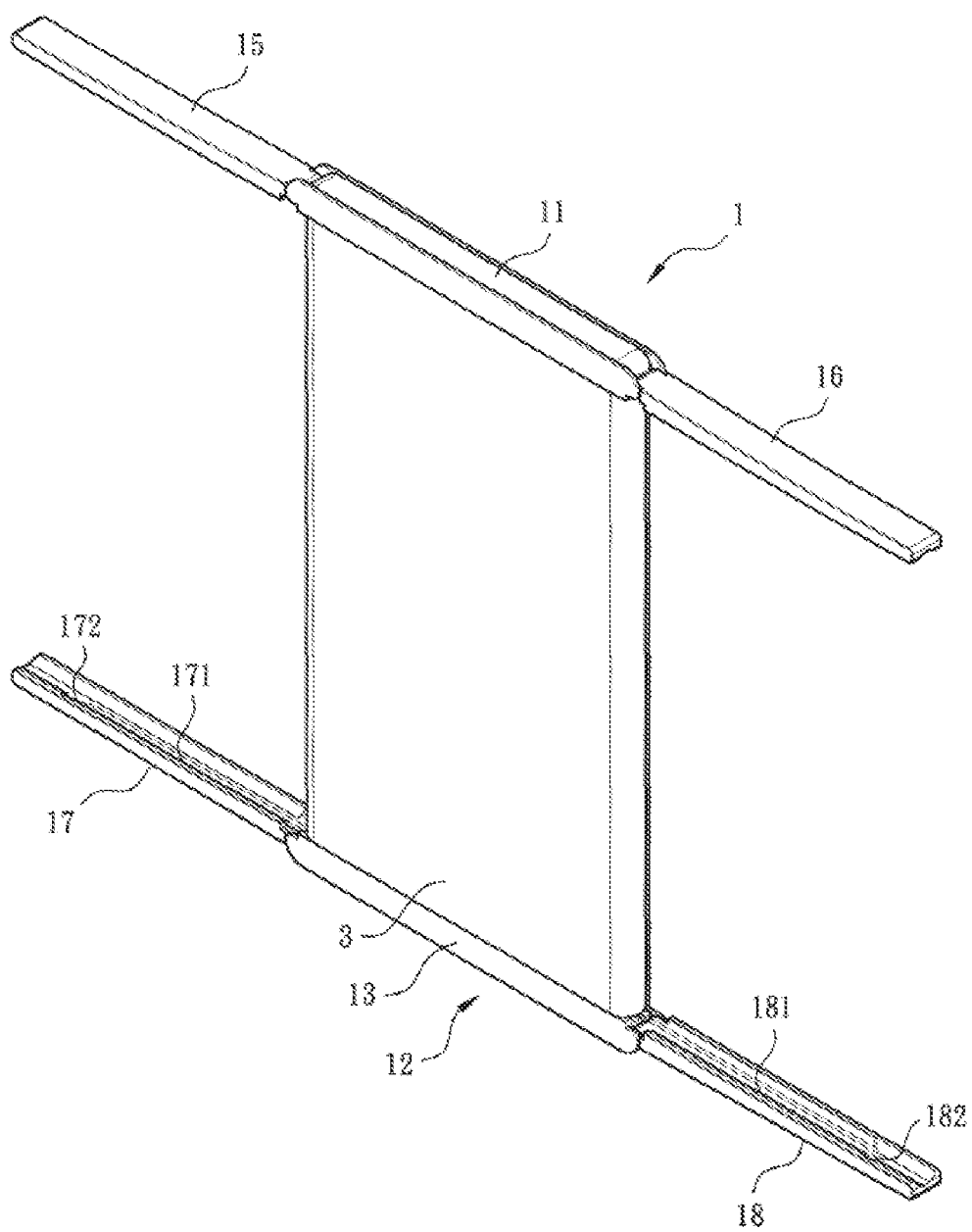
FIG. 6 is a schematic diagram showing a state where the wings are extended outwards according to the present invention.
Figure 7:
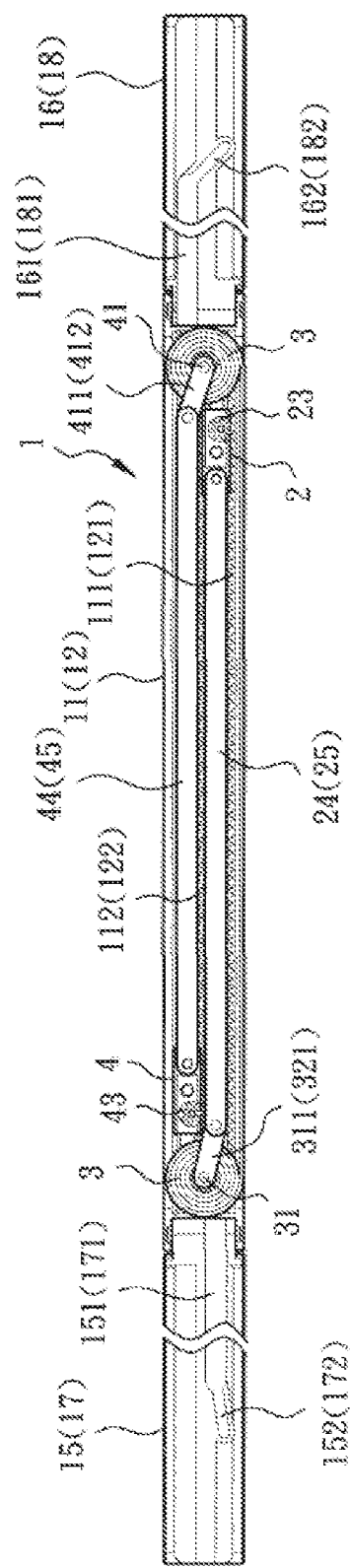
FIG. 7 shows a top cross-sectional view of FIG. 6.

When in use, the first side wings 15, 17, 16 and 18 can be pivoted outwards by 90 degrees, so that the first side guiding runners 151 and 171 are respectively engaged with the forward guiding components 111 and 121; the second side guiding runners 161 and 181 engage (as shown in FIGS. 6 and 7) the backward guiding components 112 and 122, respectively.

Figure 8:
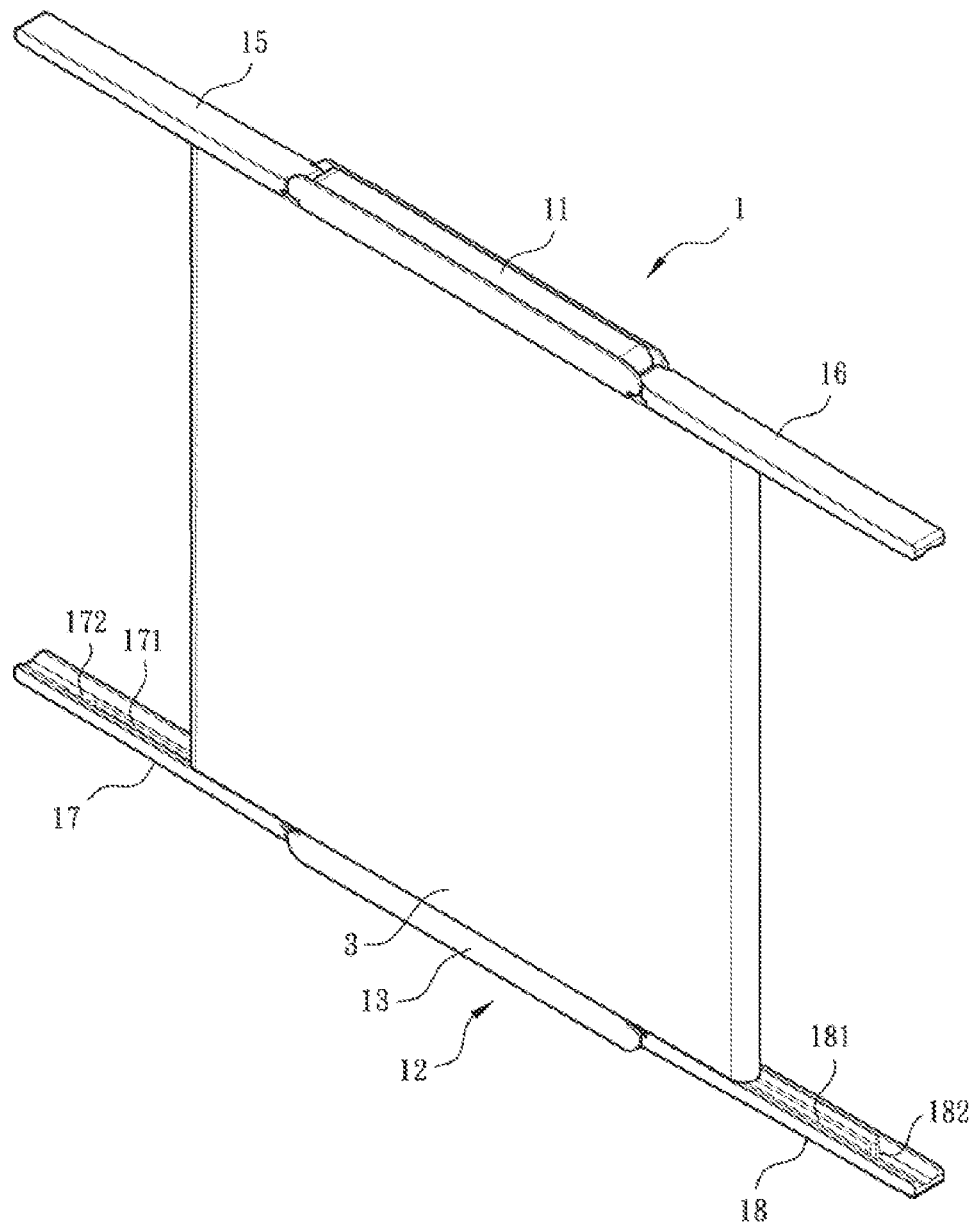
FIG. 8 is a schematic diagram of movement of the two driving components to extend the flexible screen outwards.
Figure 9:
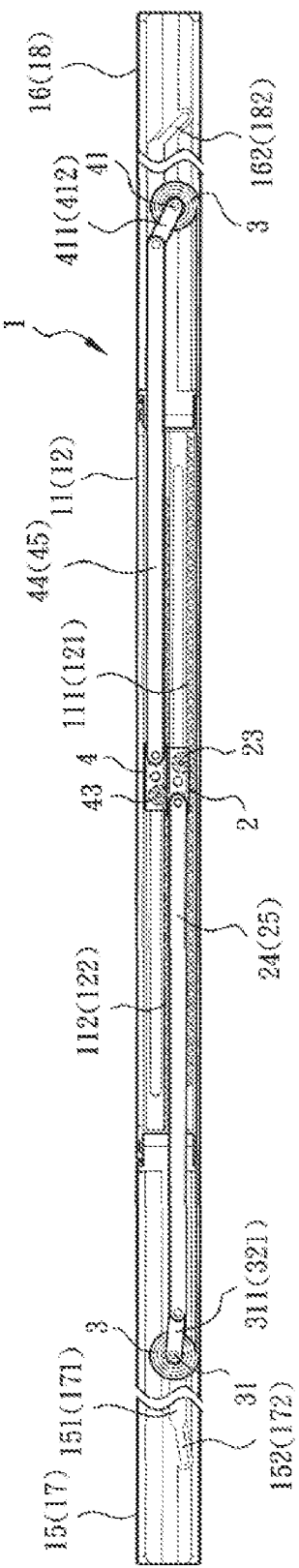
FIG. 9 shows a top cross-sectional view of FIG. 8.
Figure 10:
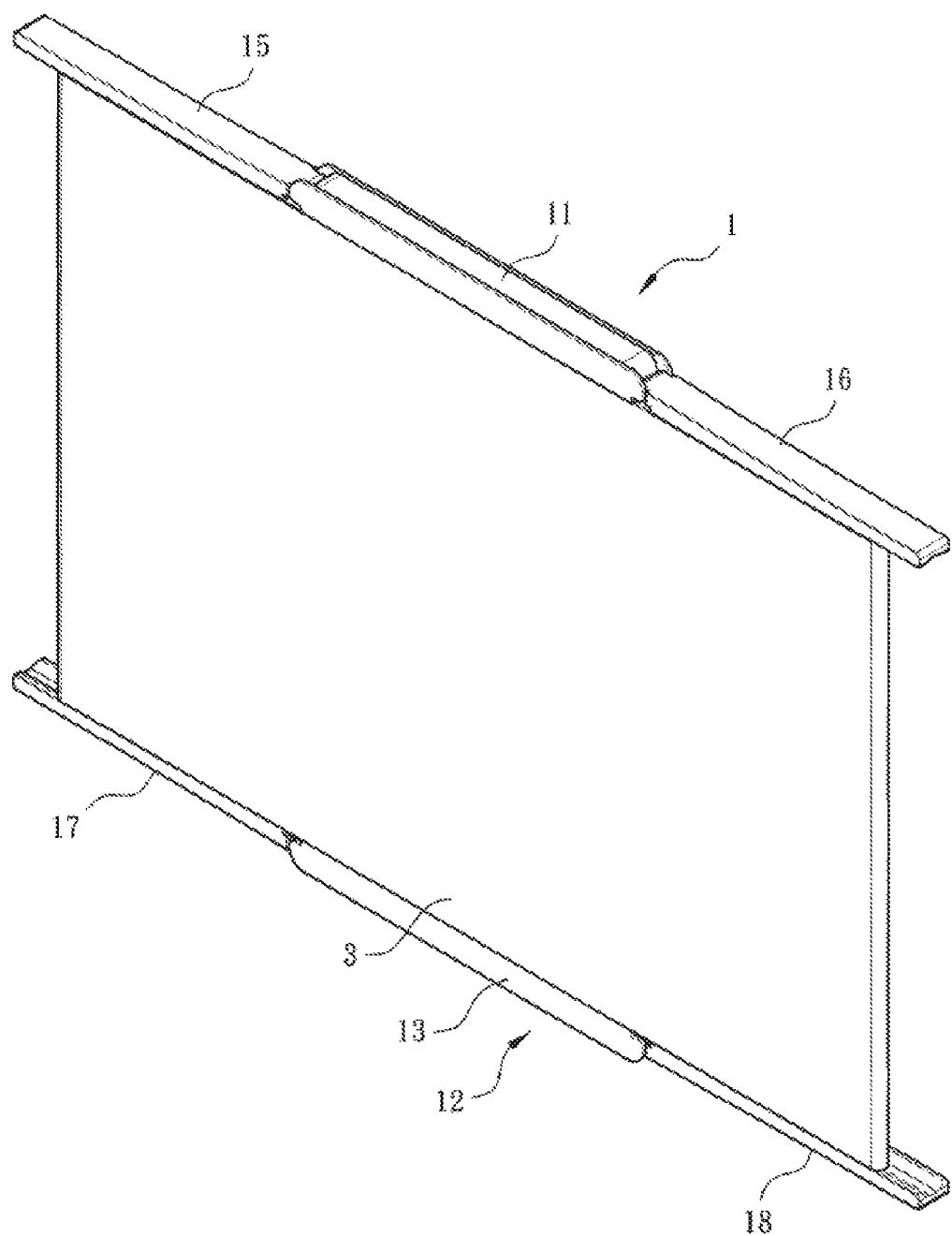
FIG. 10 is a schematic diagram showing a state where the flexible screen is completely extended by the two driving components according to the present invention.
Figure 11:
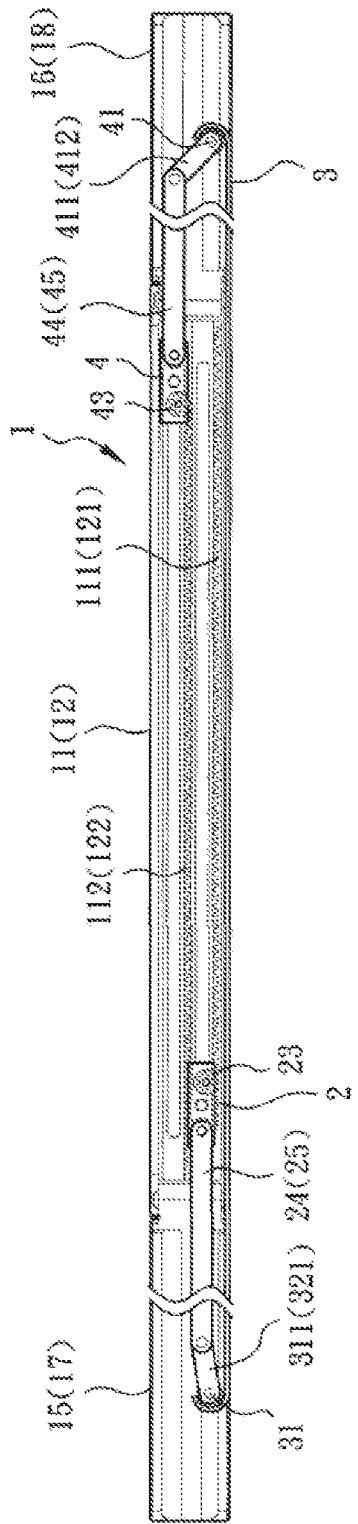
FIG. 11 shows a top cross-sectional view of FIG. 10.

After that, the two driving components 2 and 4 respectively drive the linkage components 23 and 43 (output gears) to move by the power sources 21 and 41 (motors) through the driving components 22 and 42, so that the driving component 2 can slide along the two forward guiding components 111 and 121, and simultaneously the two ends of the first rotating shaft 31 are driven to move outwards along the first side guiding runners 151 and 171, the driving component 4 can slide along the two backward guiding components 112 and 122, the two ends of the second rotating shaft 32 are driven to move outwards along the second side guiding runners 161 and 181, and the two sides of the flexible screen 3 can be gradually extended along with the outward movement of the first rotating shaft 31 and the second rotating shaft 32 (as shown in FIGS. 8 and 9).

Finally, when the driving components 2 and 4 respectively move to ends distal to each other on the forward guiding components 111 and 121 and the backward guiding components 112 and 122, the two ends of the first rotating shaft 31 can be respectively bent and embedded into the two positioning parts 152 and 172 from the two first side guiding runners 151 and 171; the two ends of the second rotating shaft 32 can be respectively bent and embedded into the two positioning parts 162 and 182 from the two second side guiding runners 161 and 181, and reverse tensile elasticity can be generated on the two sides of the flexible screen 3 by the rotating shaft holders 311 and 312 and the rotating shaft holders 321 and 322. respectively, hence the two sides of the flexible screen 3 can be fully extended and kept in a tensioned and flattened state, and a gap (shown in FIGS. 10 and 111) exists between the fully extended flexible screen 3 and an outer surface side of the first side plate 13 (or the second side plate 14) to prevent the outer surface side of the first side plate 13 (or the second side plate 14) from contacting the flexible screen 3 and causing wrinkles.

In the above structure, a scroll spring (not shown) can be provided between the first rotating shaft 31 and the second rotating shaft 32 and the rotating shaft holders 311, 312, 321 and 322 as required, respectively, and when the first rotating shaft 31 and the second rotating shaft 32 drive the two sides of the flexible screen 3 to be gradually extended outwards, each scroll spring is in a compressed state; when the first rotating shaft 31 and the second rotating shaft 32 move inwards and closer to each other, the first rotating shaft 31 and the second rotating shaft 32 can reversely rotate by utilizing the spring-back elasticity of each scroll spring, whereby the flexible screen 3 is rolled back to the original retracted state.

When the structure is put to actual use, the driving component 4 (or the driving component 2) and the second rotating shaft 32 (or the first rotating shaft 31) can be directly omitted, and the side of the flexible screen 3 distal to the first rotating shaft 31 (or the second rotating shaft 32) is positioned in the main base 1 at a part proximate to the second hollow part 102 (or the first hollow part 101), the first rotating shaft 31 (or the second rotating shaft 32) is driven to move outwards by the driving component 2 (or the driving component 4) alone, and a similar effect of extending the flexible screen 3 can be achieved.

To summarize the above, the extendable display screen structure of the present invention is different from the prior art, and can produce a relatively integral display effect through a relatively simple action, featuring indeed novelty and progress as an invention, and thus an application for an invention patent is submitted according to law; the above description is only the preferred embodiment of the invention, and alternations, modifications, changes or equivalent substitutions without departing the spirit and scope of the invention shall fall within the scope of the appended claims.

The invention claimed is:

1. An extendable display screen structure, at least comprising:
a hollow main base, wherein the hollow main base is provided with at least one hollow part which opens to the outside, and guiding components are symmetrically provided in the main base along two sides of the hollow part, respectively;
at least one driving component, wherein the at least one driving component is provided in the main base, and the driving component can move along the guiding component to extend out of the main base; and
a flexible screen, wherein the flexible screen is wound around an outer periphery of at least one rotating shaft, the rotating shaft is rotatably disposed on the driving component, can move out of a side of the main base preferentially and form linkage, and when the driving component, in linkage with the rotating shaft, moves to the outside of the main base along the guiding component, the flexible screen can be gradually released and extended outwards from the outer periphery of the rotating shaft,
wherein the driving component is provided with a power source, and the power source can drive the driving component to move along the guiding component,
wherein the main base is provided with two opposite first and second hollow parts, two forward guiding components are symmetrically arranged in the main base along two sides of the first hollow part, and two backward guiding components extending in a reverse direction to the forward guiding components are symmetrically arranged in the main base along two sides of the second hollow part; the two driving components are provided in the main base, each of the driving components is provided with a power source that drives the driving component to move along the forward or backward guiding component, respectively; two sides of the flexible screen are respectively wound around the outer peripheries of the first rotating shaft and the second rotating shaft, the first rotating shaft and the second rotating shaft are rotatably arranged, respectively, on sides of the two driving components to form linkage, and when the two driving components, in linkage with the first rotating shaft and the second rotating shaft, respectively, move out of the main base along the forward guiding component and the backward guiding component, the flexible screen can be gradually released from the peripheries of the first rotating shaft and the second rotating shaft to be extended outwards,
wherein the main base is provided pivotably with first side wings on two sides of the first hollow part, respectively, the two first side wings can be turned inwards to cover the first hollow part, and can be turned outwards to open the first hollow part; moreover, second side wings are provided pivotably on two sides of the second hollow part, respectively, the two second side wings can be turned inwards to cover the second hollow part, and can be turned outwards to open the second hollow part.

2. The extendable display screen structure according to claim 1, wherein the two first side wings are respectively provided with a first side guiding runner engaged with the forward guiding component on a side surface facing the first hollow part when retracted, and the first side guiding runners can form sliding guide to engage the forward guiding component on two ends of the first rotating shaft when the first side wings horizontally extend outwards; the two second side wings are respectively provided with a second side guiding runner engaged with the backward guiding component on a side surface facing the second hollow part when retracted, and the second side guiding runners can form sliding guide to engage the backward guiding component on two ends of the second rotating shaft when the second side wings horizontally extend outwards.

3. The extendable display screen structure according to claim 2, wherein a positioning part with a biasing space is formed on the first guiding runner and the second guiding runner, respectively, at an end distal to the main base, and the positioning parts protrude out of a front side or a rear side of the main base with ends aligned.

4. An extendable display screen structure, at least comprising:
- a hollow main base, wherein the hollow main base is provided with at least one hollow part which opens to the outside, and guiding components are symmetrically provided in the main base along two sides of the hollow part, respectively;
- at least one driving component, wherein the at least one driving component is provided in the main base, and the driving component can move along the guiding component to extend out of the main base; and
- a flexible screen, wherein the flexible screen is wound around an outer periphery of at least one rotating shaft, the rotating shaft is rotatably disposed on the driving component, can move out of a side of the main base preferentially and form linkage, and when the driving component, in linkage with the rotating shaft, moves to the outside of the main base along the guiding component, the flexible screen can be gradually released and extended outwards from the outer periphery of the rotating shaft,
- wherein the driving component is provided with a power source, and the power source can drive the driving component to move along the guiding component,
- wherein the main base is provided with two opposite first and second hollow parts, two forward guiding components are symmetrically arranged in the main base along two sides of the first hollow part, and two backward guiding components extending in a reverse direction to the forward guiding components are symmetrically arranged in the main base along two sides of the second hollow part; the two driving components are provided in the main base, each of the driving components is provided with a power source that drives the driving component to move along the forward or backward guiding component, respectively; two sides of the flexible screen are respectively wound around the outer peripheries of the first rotating shaft and the second rotating shaft, the first rotating shaft and the second rotating shaft are rotatably arranged, respectively, on sides of the two driving components to form linkage, and when the two driving components, in linkage with the first rotating shaft and the second rotating shaft, respectively, move out of the main base along the forward guiding component and the backward guiding component, the flexible screen can be gradually released from the peripheries of the first rotating shaft and the second rotating shaft to be extended outwards,
- wherein the two driving components are respectively provided with two parallel main holders, the first rotating shaft and the second rotating shaft are respectively provided pivotably with a rotating shaft holder proximate to two ends, the rotating shaft holder of the first rotating shaft is pivotably connected with the two main holders of one of the driving components, the rotating shaft holder of the second rotating shaft is pivotably connected with the two main holders of the other driving component, and each of the rotating shaft holders has pivot elasticity relative to the main holders pivotably connected therewith, so that the rotating shaft holders of the first rotating shaft and the second rotating shaft generate tensile elasticity on two sides of the flexible screen, respectively, thereby ensuring that the flexible screen can maintain a tensioned and flattened state after being completely extended.

5. The extendable display screen structure according to claim 4, wherein the main base is provided with two parallel first and two frame strips, a first side plate and a second side plate are attached to two sides of the first frame strip and the second frame strip, respectively, so that a hollow accommodating space is enclosed by the first frame strip, the second frame strip, the first side plate and the second side plate, and the first hollow part and the second hollow part are respectively formed on two sides of the accommodating space between the first frame strip and the second frame strip.

6. An extendable display screen structure, at least comprising:
- a hollow main base, wherein the hollow main base is provided with at least one hollow part which opens to the outside, and guiding components are symmetrically provided in the main base along two sides of the hollow part, respectively;
- at least one driving component, wherein the at least one driving component is provided in the main base, and the driving component can move along the guiding component to extend out of the main base; and
- a flexible screen, wherein the flexible screen is wound around an outer periphery of at least one rotating shaft, the rotating shaft is rotatably disposed on the driving component, can move out of a side of the main base preferentially and form linkage, and when the driving component, in linkage with the rotating shaft, moves to the outside of the main base along the guiding component, the flexible screen can be gradually released and extended outwards from the outer periphery of the rotating shaft,
- wherein the driving component is provided with a power source, and the power source can drive the driving component to move along the guiding component,
- wherein the main base is provided with two opposite first and second hollow parts, two forward guiding components are symmetrically arranged in the main base along two sides of the first hollow part, and two backward guiding components extending in a reverse direction to the forward guiding components are symmetrically arranged in the main base along two sides of the second hollow part; the two driving components are provided in the main base, each of the driving components is provided with a power source that drives the driving component to move along the forward or backward guiding component, respectively; two sides of the flexible screen are respectively wound around the outer peripheries of the first rotating shaft and the second rotating shaft, the first rotating shaft and the second rotating shaft are rotatably arranged, respectively, on sides of the two driving components to form linkage, and when the two driving components, in linkage with the first rotating shaft and the second rotating shaft, respectively, move out of the main base along the forward guiding component and the backward guiding component, the flexible screen can be gradually released from the peripheries of the first rotating shaft and the second rotating shaft to be extended outwards,
- wherein each of the driving components is respectively provided with a set of linkage components driven by the power source, and each set of linkage components is respectively connected to the forward guiding component and the backward guiding component,
wherein the two driving components are respectively provided with two parallel main holders, the first rotating shaft and the second rotating shaft are respectively provided pivotably with a rotating shaft holder proximate to two ends, the rotating shaft holder of the first rotating shaft is pivotably connected with the two main holders of one of the driving components, the rotating shaft holder of the second rotating shaft is pivotably connected with the two main holders of the other driving component, and each of the rotating shaft holders has pivot elasticity relative to the main holders pivotably connected therewith, so that the rotating shaft holders of the first rotating shaft and the second rotating shaft generate tensile elasticity on two sides of the flexible screen, respectively, thereby ensuring that the flexible screen can maintain a tensioned and flattened state after being completely extended, wherein the main base is provided with two parallel first and two frame strips, a first side plate and a second side plate are attached to two sides of the first frame strip and the second frame strip, respectively, so that a hollow accommodating space is enclosed by the first frame strip, the second frame strip, the first side plate and the second side plate, and the first hollow part and the second hollow part are respectively formed on two sides of the accommodating space between the first frame strip and the second frame strip.

7. The extendable display screen structure according to claim 6, wherein the forward guiding component and the backward guiding component are forward and backward racks arranged in opposite directions, the power sources are motors, and the linkage components are output gears driven by the motors and meshed with the forward and backward racks, respectively.

* * * * *